(12) United States Patent
Arora et al.

(10) Patent No.: US 8,044,733 B1
(45) Date of Patent: Oct. 25, 2011

(54) STRESS TOLERANT DIFFERENTIAL COLPITTS VOLTAGE CONTROLLED OSCILLATORS

(75) Inventors: Himanshu Arora, Santa Clara, CA (US); Belal Helal, Santa Clara, CA (US); Chuan-Cheng Cheng, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 86 days.

(21) Appl. No.: 12/534,609

(22) Filed: Aug. 3, 2009

Related U.S. Application Data

(60) Provisional application No. 61/086,976, filed on Aug. 7, 2008.

(51) Int. Cl.
*H03B 5/12* (2006.01)
*H03C 3/22* (2006.01)

(52) U.S. Cl. .............................. 331/117 FE; 331/177 V

(58) Field of Classification Search ................ 331/36 C, 331/36 R, 117 FE, 117 R, 167, 177 V
See application file for complete search history.

(56) References Cited

U.S. PATENT DOCUMENTS

| | | | | |
|---|---|---|---|---|
| 2,930,002 | A * | 3/1960 | Edwards et al. | 331/116 R |
| 3,227,968 | A * | 1/1966 | Brounley | 332/136 |
| 3,256,496 | A * | 6/1966 | Angel | 331/116 R |
| 4,047,127 | A * | 9/1977 | Alexander | 332/174 |
| 6,002,303 | A * | 12/1999 | Carralero et al. | 331/117 R |
| 6,297,704 | B1 * | 10/2001 | Nicholls et al. | 331/34 |
| 6,781,471 | B2 * | 8/2004 | Huang | 331/117 R |
| 6,946,924 | B2 * | 9/2005 | Chominski | 331/177 V |
| 6,987,423 | B2 * | 1/2006 | Brueske et al. | 331/36 C |
| 7,002,423 | B1 * | 2/2006 | Drakhlis et al. | 331/158 |
| 7,227,423 | B2 * | 6/2007 | McCorquodale et al. | 331/179 |
| 7,545,230 | B2 * | 6/2009 | Jang et al. | 331/177 V |
| 7,589,598 | B2 * | 9/2009 | Jang et al. | 331/49 |

OTHER PUBLICATIONS

Li, Xiaoyong, Shekhar, Sudip, and Allstot, David J., Gm-Boosted Common-Gate LNA and Differential Colpitts VCO/QVCO in 0.18-μm CMOS, IEEE Journal of Solid-State Circuits, vol. 40, No. 12, Dec. 2005, pp. 2609-2619.

\* cited by examiner

*Primary Examiner* — Levi Gannon

(57) ABSTRACT

Some of the embodiments of the present disclosure provide an apparatus comprising a voltage controlled oscillator (VCO) having a first transistor, a first resistor operatively coupled between a first terminal of the first transistor and a first node, a first capacitor operatively coupled between a second terminal of the first transistor and the first node, and a second capacitor operatively coupled to the first node, wherein the first capacitor and the second capacitor forms a capacitive voltage divider. Other embodiments are also described and claimed.

19 Claims, 3 Drawing Sheets

STRESS TOLERANT DIFFERENTIAL COLPITTS VOLTAGE CONTROLLED OSCILLATORS

CROSS REFERENCE TO RELATED APPLICATIONS

The present application claims priority to U.S. Patent Application No. 61/086,976, filed Aug. 7, 2008, entitled "STRESS TOLERANT LOW VOLTAGE COLPITTS VOLTAGE CONTROLLED OSCILLATOR," the entire specification of which is hereby incorporated by reference in its entirety for all purposes, except for those sections, if any, that are inconsistent with this specification.

TECHNICAL FIELD

Embodiments of the present invention relate to voltage controlled oscillators (VCOs), and more specifically to differential colpitts VCOs.

BACKGROUND

FIG. 1 schematically illustrates an exemplary differential colpitts voltage controlled oscillator (VCO) 100. The differential colpitts VCO 100 is generally well known to those skilled in the art. The VCO 100 of FIG. 1 may include differential pair transistors T1 and T2, and a tank of inductors L1 and L2 and varactors C3 and C4. The transistor pair T1 and T2 may be cross coupled such that the drain of one transistor is operatively coupled to the gate of the other transistor. The transistors T1 and T2 may be biased by respective bias current sources $I_{bias1}$ and $I_{bias2}$. The drain terminals of transistors T1 and T2 may form the two output terminals O/P1 and O/P2 of the VCO 100. The source terminals of transistors T1 and T2 may be operatively coupled to nodes 122 and 124, respectively. A resonator circuit of the VCO 100 may include the series of inductors L1 and L2 and the series of varactor C3 and C4. A supply voltage Vdd (operatively coupled at the centre tap of the inductors L1 and L2) and a control voltage Vcontrol (operatively coupled in between the varactors C3 and C4) may control the output voltage swing and frequency.

The VCO 100 may also include capacitors C11 and C12 that form a capacitive voltage divider, where capacitor C11 may be operatively coupled to node 122 and drain terminal of the transistor T1, and capacitor C12 may be operatively coupled between node 122 and the ground. Similarly, capacitors C21 and C22 may form a capacitive voltage divider, where capacitor C21 may be operatively coupled to node 124 and drain terminal of the transistor T2, and capacitor C22 may be operatively coupled between node 124 and the ground.

For some applications, it may be desirable that the output voltage of the VCO 100 has a relatively higher voltage swing. For a given frequency, higher output voltage swing may increase a slew rate of the output voltage, and thus may result in relatively lower phase noise. An increase in the output voltage swing may be achieved, for example, by increasing the supply voltage Vdd, appropriately tuning one or more inductors and/or capacitors of VCO 100, and/or the like.

Also, with improvements in integration of semiconductor devices and developments in semiconductor manufacturing technology, thin oxide based low voltage devices are increasingly used in various applications. For example, thin oxide based low voltage transistors are increasingly used in radio frequency (RF) applications, which may require the transistors to operate at GHz frequencies. To ensure faster switching at GHz frequencies, the transistors T1 and T2 may be low voltage thin oxide transistors, i.e., may operate at a relatively low operating voltage (e.g., as compared to thick oxide devices rated for higher operating voltage). Such low voltage transistors, by virtue of being based on thin gate oxide, may be able to withstand a relatively lower level of stress voltage.

For the purpose of this disclosure and unless otherwise mentioned, a maximum stress tolerance voltage of a transistor may refer to approximately a maximum voltage that any two terminals of a transistor may be able to tolerate or withstand, without stressing the transistor (e.g., without adversely affecting one or more intrinsic characteristics of the transistor, such as mobility, threshold voltage of the transistor, intrinsic noise traits etc). For example, for a given submicron CMOS process, the operating voltage of transistors T1 and T2 may be about 1.2 volts (V), and the transistors T1 and T2 may have a safety margin of about 20%. Accordingly, the maximum stress tolerance voltage of transistors T1 and T2 may be about 1.4 V. That is, if the maximum voltage across any two terminals of transistors T1 and T2 (e.g., Vgs, Vgd, Vds) exceeds 1.4 V, the transistor is assumed to be operating under stress, which may degrade the performance (e.g., degrade the yield and noise) of the transistor, thereby degrading the phase noise of the VCO.

As previously discussed, for some applications, it may be desirable to have a higher output voltage swing of the VCO 100, for a given frequency of oscillation. However, if the output voltage swing is increased (e.g., by increasing Vdd), the maximum voltage experienced across any two terminals of the transistor T1 and/or T2 may also increase, and may exceed the maximum stress tolerance voltage of the transistors. For example, for nominal values of various components of the VCO 100 and for an output voltage swing of 1.2 V, the voltage swing of Vgs and/or Vds of the transistors T1 and T2 may exceed 1.4 V for about 15% of the duty cycle time. Thus, in case the transistors T1 and T2 are thin oxide low voltage transistors with a maximum stress tolerance voltage of 1.4 V, the transistors T1 and T2 may be in stress for about 15% of time the VCO is oscillating. The amount and duration of stress on the transistors may increase further with a further increase in the output voltage swing. For example, the transistors T1 and T2 may be in stress for about 22% of the duty cycle time for an output voltage swing of about 1.3 V Thus, the VCO 100 with thin oxide low voltage transistors T1 and T2 may not be able to handle a relatively large output voltage swing (e.g., output voltage swing of 1.2 V or more) without stressing the transistors T1 and T2.

SUMMARY

In various embodiments, the present disclosure provides a voltage controlled oscillator (VCO) comprising a first transistor, a first resistor operatively coupled between a first terminal of the first transistor and a first node, a first capacitor operatively coupled between a second terminal of the first transistor and the first node, and a second capacitor operatively coupled to the first node, wherein the first capacitor and the second capacitor forms a capacitive voltage divider. In various embodiments, the VCO further comprises a second transistor, wherein the first transistor and the second transistor forms a cross coupled transistor pair, a second resistor operatively coupled between a first terminal of the second transistor and a second node, and a second capacitor operatively coupled between a second terminal of the second transistor and the second node. In various embodiments, a first voltage is substantially equal to a maximum stress tolerance voltage of the first transistor, a second voltage is substantially equal to a maximum voltage swing that any two terminals of the first transistor would experience if the values of the first and second resistances were almost equal to 0 ohm, a third voltage is substantially equal to a difference between the first and second voltages, a first current is substantially equal to a maximum current that the first terminal of the first transistor would experience if the values of the first and second resistances were almost equal to 0 ohm, and wherein a value of the first resistor is chosen to be substantially equal to a ratio of the third voltage and the first current.

In various embodiments, a gate terminal of the first transistor is operatively coupled to a drain terminal of the second transistor, and a gate terminal of the second transistor is operatively coupled to a drain terminal of the first transistor. The VCO may further comprise a fourth capacitor operatively coupled to the second node, wherein the third capacitor and the fourth capacitor forms another capacitive voltage divider. The VCO may further comprise an inductor-capacitor (LC) resonator circuit operatively coupled to drain terminals of the first and second transistors. The VCO may be a differential colpitts VCO. The first terminal of the first transistor may be the source terminal of the first transistor, and wherein the first terminal of the second transistor may be the source terminal of the second transistor. In various embodiments, the first resistor and the second resistor may be configured to reduce a maximum voltage experienced by any two terminals of the first transistor and the second transistor, without decreasing a swing of an output voltage of the VCO and without affecting a phase noise of the VCO. The first transistor and the second transistor may be thin oxide low voltage transistors. The first and second resistors may be selected from a group comprising metal-oxide-semiconductor field-effect transistors (MOSFETs), bipolar junction transistors (BJT), field effect transistors (FET), junction gate field-effect transistors (JFET), and the like. The first and second resistances may be adjustable resistances, and where a values of the first and second resistances may be programmed based at least in part on a desired voltage swing of an output voltage of the VCO, maximum stress tolerance levels of the first and second transistors, a maximum voltage swing experienced by any two terminals of the first and second transistors, and maximum bias currents of the first and second transistors.

In various embodiments, the present disclosure also provides a differential colpitts voltage controlled oscillator (VCO) comprising a cross coupled transistor pair comprising a first transistor and a second transistor, a first capacitive voltage divider associated with the first transistor and comprising at least a first capacitor, a second capacitive voltage divider associated with the second transistor and comprising at least a second capacitor, a first resistor operatively coupled between a source terminal of the first transistor and the first capacitor, and a second resistor operatively coupled between a source terminal of the second transistor and the second capacitor. The first capacitive voltage divider may comprise a third capacitor having an end operatively coupled in between the first capacitor and the first resistor. The third capacitor may also a part of the second capacitive voltage divider, and another end of the third capacitor may be operatively coupled in between the second capacitor and the second resistor. The drain terminals of the first and second transistors may be operatively coupled to two output ports of the VCO. The first and second resistors may be configured to reduce a maximum voltage swing of a gate to source voltage of the first transistor and second transistor, respectively, below a threshold voltage level, without affecting a swing of an output voltage of the VCO. The first and second transistors may be biased using a cascode current source.

In various embodiments, the present disclosure also provides a method of forming a differential colpitts voltage controlled oscillator, the method comprising forming a cross coupled transistor pair that comprises a first transistor and a second transistor, forming a first capacitive voltage divider associated with the first transistor, the first capacitive voltage divider comprising at least a first capacitor, forming a second capacitive voltage divider associated with the second transistor, the second capacitive voltage divider comprising at least a second capacitor, degenerating a transconductance of the first transistor by operatively coupling a first resistor between a source terminal of the first transistor and the first capacitor, and degenerating a transconductance of the second transistor by operatively coupling a second resistor between a source terminal of the second transistor and the second capacitor. The method may further comprise biasing the first transistor and the second transistor using a cascode current mirror.

BRIEF DESCRIPTION OF THE DRAWINGS

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use the phrases "in an embodiment," or "in embodiments," which may each refer to one or more of the same or different embodiments. The phrase "in some embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "NB" means (A), (B), or (A and B), similar to the phrase "A and/or B." The phrase "at least one of A, B and C" means (A), (B), (C), (A and B), (A and C), (B and C) or (A, B and C). The phrase "(A) B" means (B) or (A and B), that is, A is optional.

Figure 2:
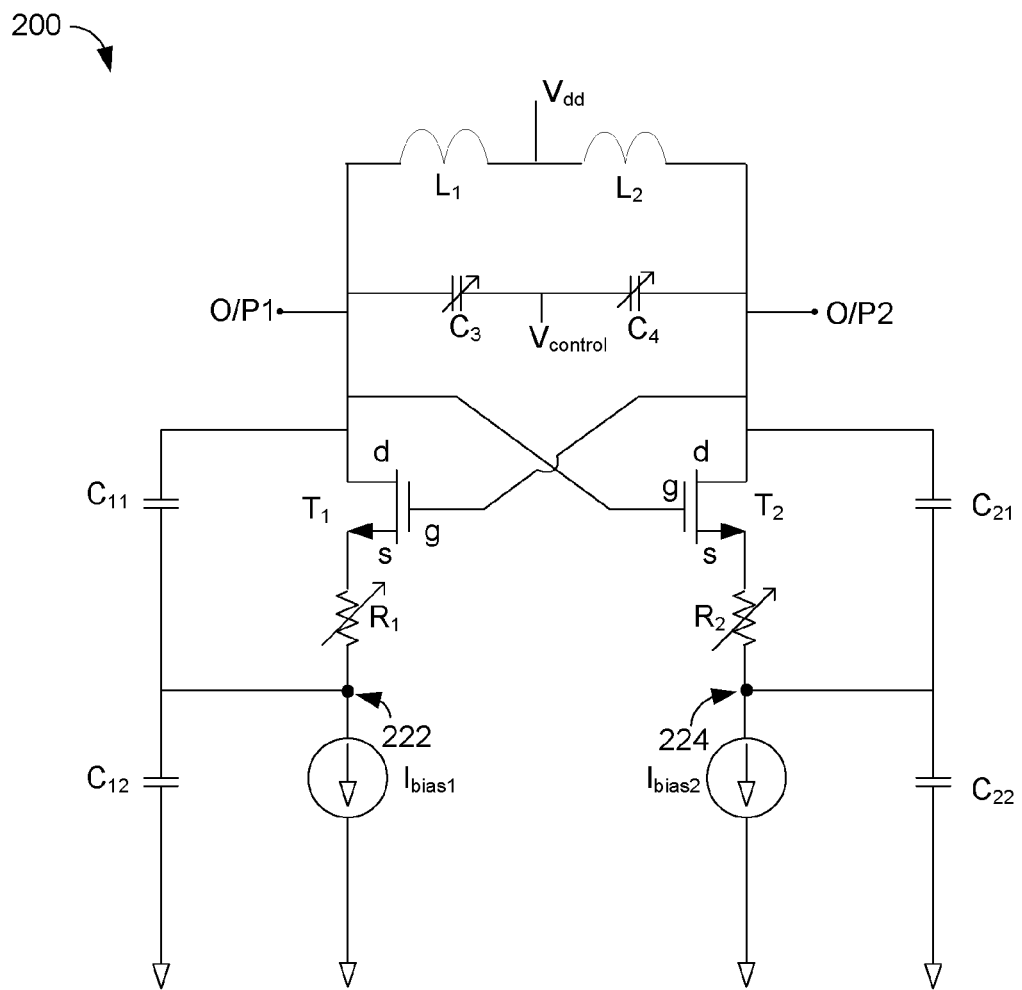
FIG. 2 schematically illustrates an exemplary differential colpitts VCO, in accordance with various embodiments of the present invention.

FIG. 2 schematically illustrates an exemplary differential colpitts VCO 200, in accordance with various embodiments of the present invention. The VCO 200 may be used in a variety of applications, including, for example, in a phase locked loop (PLL) circuit.

Figure 1:
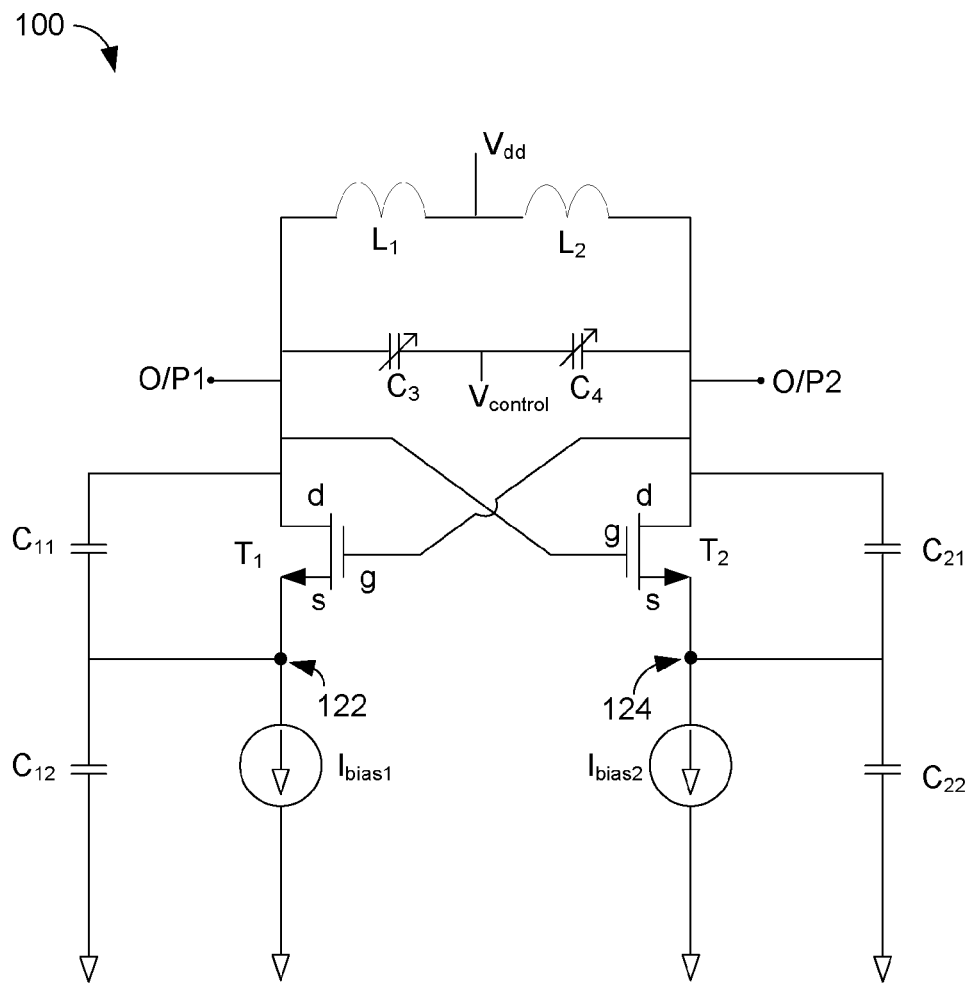
FIG. 1 schematically illustrates an exemplary differential colpitts VCO.

In various embodiments, one or more components of the VCO 200 may be at least in part similar to the corresponding components of the VCO 100 of FIG. 1. For example, similar to VCO 100, the VCO 200 may also include the differential pair transistors T1 and T2, and the tank of inductors L1 and L2 and varactors C3 and C4. The transistor pair T1 and T2 may be cross coupled such that the drain of one transistor is operatively coupled to the gate of the other transistor. Such a cross coupled configuration of the transistor may facilitate a oscillation or swing of an output voltage of the VCO 200.

In various embodiments, the transistors T1 and T2 may be N channel metal-oxide-semiconductor field-effect transistors (MOSFETs), although other appropriate types of transistors (e.g., bipolar junction transistor (BJT), field effect transistor (FET), junction gate field-effect transistor (JFET), or the like) may also be used. In various embodiments, transistors T1 and T2 may be thin gate oxide low voltage transistors used in typical submicron CMOS process.

The transistors T1 and T2 may be biased by respective bias current sources $I_{bias1}$ and $I_{bias2}$. The drain terminals of transistors T1 and T2 may form the two output terminals O/P1 and O/P2 of the VCO 200. A resonator circuit of the VCO 200 may include the series of inductors L1 and L2 and the series of varactors C3 and C4. The supply voltage Vdd (operatively coupled in between the inductors L1 and L2) and the control voltage Vcontrol (operatively coupled in between the capacitors L1 and L2) may control the output voltage swing and frequency. Similar to the VCO 100 of FIG. 1, the VCO 200 may also include capacitors C11 and C12 that form a capacitive voltage divider, and capacitors C21 and C22 that form another capacitive voltage divider. In various embodiments, the capacitive voltage divider comprising of C11 and C12 forms a positive feedback loop across the transistor T1. This capacitive voltage divider may enhance the transconductance gm of the transistor T1, which may facilitate the voltage swing for a given bias current. Similarly, the capacitive voltage divider comprising of C11 and C12 may form a positive feedback loop, thereby enhancing the transconductance gm of the transistor T2, which may facilitate the voltage swing at the output terminals of the VCO 200.

The two capacitive voltage dividers form a distinguishing characteristic of a differential colpitts VCO. In contrast, some of the other conventional VCOs include a differential pair of transistors, but no capacitive voltage divider associated with each of the transistors.

In various embodiments, the VCO 200 of FIG. 2 may also include a first resistor R1 operatively coupled between the source terminal of the transistor T1 and node 222, and a second resistor R2 operatively coupled between the source terminal of the transistor T2 and node 224. In various embodiments, the resistors R1 and R2 may be adjustable, as illustrated in FIG. 2. However, in other embodiments, the resistors R1 and/or R2 may have fixed values. One end of the capacitors C11 and C12 and the bias current source $I_{bias1}$ may also be operatively coupled to node 222, as illustrated in FIG. 2.

Similarly, one end of the capacitors C11 and C12 and the bias current source $I_{bias2}$ may also be operatively coupled to node 224.

In various embodiments, the resistors R1 and R2 may facilitate in decreasing a stress voltage experienced by the transistors T1 and/or T2 (e.g., decreasing a maximum voltage swing experienced by any two terminals of transistors T1 and/or T2), without substantially decreasing an output voltage swing of the VCO 200. In various embodiments, the resistors R1 and R2 may act as degeration resistances, and may decrease a transconductance gm of the transistors T1 and T2, respectively. In various embodiments, this decrease in gm may be countered at least partially by increasing the currents of the current sources $I_{bias1}$ and $I_{bias2}$. Also, the resistors R1 and R2 may increase the output impedances of the transistors T1 and T2, and may not affect loading of the VCO tank significantly.

In various embodiments, the values of the resistances R1 and R2 may be chosen such that the resistances may not significantly affect the output voltage swing of the output of the VCO, and may also not affect the phase noise of the VCO.

In various embodiments, a voltage ΔV1 may be a difference between a first voltage V11 and a second voltage V12, where V11 may be approximately equal to a maximum stress tolerance voltage of transistors T1. Voltage V12 may be approximately equal to a maximum voltage that any two terminals (e.g., gate and source terminals) of the transistor T1 may experience if the value of the resistance R1 is almost equal to 0 ohm, for a given output voltage swing. That is, voltage V12 may be substantially equal to the maximum voltage swing of any two terminals of transistor T1 of the VCO 100 of FIG. 1 (in which R1 is not present). Thus, it may be desirable to decrease the maximum stress voltage or voltage swing experienced by the transistor T1 by at least ΔV1, so that the transistor T1 is not stressed during operation. In various embodiments, a current $I_{d1max}$ may be substantially equal to a maximum current that the drain terminal of the transistor T1 would experience if the value resistance R1 of VCO 200 was almost equal to 0 ohm, for the given output voltage swing. Thus, $I_{d1max}$ may be substantially equal to a maximum current that the drain terminal of the transistor T1 experiences in the VCO 100 (where R1 is not present). In various embodiments, the transistor T1 may experience the maximum drain current $I_{d1max}$ substantially simultaneously with the transistor T1 experiencing the voltage V12. The resistance R1 may be used to reduce the stress voltage experienced by the transistor T1 by ΔV1 while the transistor drain current is $I_{d1max}$. Accordingly, in various embodiments, the value of the resistance R1 may be equal to about $\Delta V1/I_{d1max}$.

Voltages ΔV2, V12, and V22, and current $I_{d2max}$ may similarly be defined with respect to transistor T2, and in various embodiments, the value of the resistance R2 may be equal to about $\Delta V2/I_{d2max}$. In various embodiments, the VCO 200 may be symmetric, i.e., transistors T1 and T2 may have similar characteristics, and the resistances R1 and R2 may have substantially equal values, but the embodiments are not necessarily limited as such.

For example, in various embodiments, the maximum stress tolerance voltage of transistor T1 (e.g., V11) may be 1.4 V, and for nominal values of various components of the VCO 200 and for 1.3 V output voltage swing, the maximum swing of voltages Vgs, Vds and/or Vgd over time (e.g., voltage V12) may be about 1.5 V. Thus, ΔV1 may be about 100 mV. Also, the maximum drain current $I_{d1max}$ may be about 10 milliAmpere (mA), which may be experienced by the transistor T1 when the associated voltage swing is maximum. Thus, the value of resistance R1 (and also R2, in case transistor T2 has similar characteristics as transistor T1) may be equal to about 100 mV/10 mA=10 ohm.

It is well known to those skilled in the art that improving VCO phase noise involves lowering the resistance (losses) in the VCO tank network. However, in various embodiments, introduction of the resistors R1 and R2 at the respective source terminals of the transistors, and judicious selection of the resistor R1 and R2 values may ensure that the resistors R1 and R2 does not adversely impact the phase noise of the VCO 200, and at the same time lowers the stress voltage to which the transistors T1 and T2 are subjected to. In various embodiments, having a relatively higher value of the resistances R1 and/or R2 (e.g., higher than $\Delta V1/I_{d1max}$ and/or $\Delta V2/I_{d2max}$) may adversely affect the phase noise of the VCO 200. On the other hand, having a relatively lower value of the resistances R1 and/or R2 (e.g., lower than $\Delta V1/I_{d1max}$ and/or $\Delta V2/I_{d2max}$) may not fully mitigate the stress of the transistors T1 and/or T2.

Thus, the resistances R1 and R2 may facilitate in decreasing the maximum voltage swing of voltages Vgs, Vgd and/or Vds of transistors T1 and/or T2 below a threshold voltage level (e.g., maximum stress tolerance voltage), without significantly decreasing the output voltage swing of the VCO 200, and without significantly adversely affecting the phase noise of the VCO 200.

In various embodiments, the resistances R1 and R2 may be fixed or adjustable. For example, the resistance values of R1 and R2 may be adjusted based at least in part on a desired output voltage swing, a frequency of the output voltage, a maximum stress tolerance levels of transistors T1 and T2, a maximum voltage swing experienced by any two terminals of transistors T1 and/or T2, the bias currents of the transistors T1 and T2, and/or the like.

Figure 3:
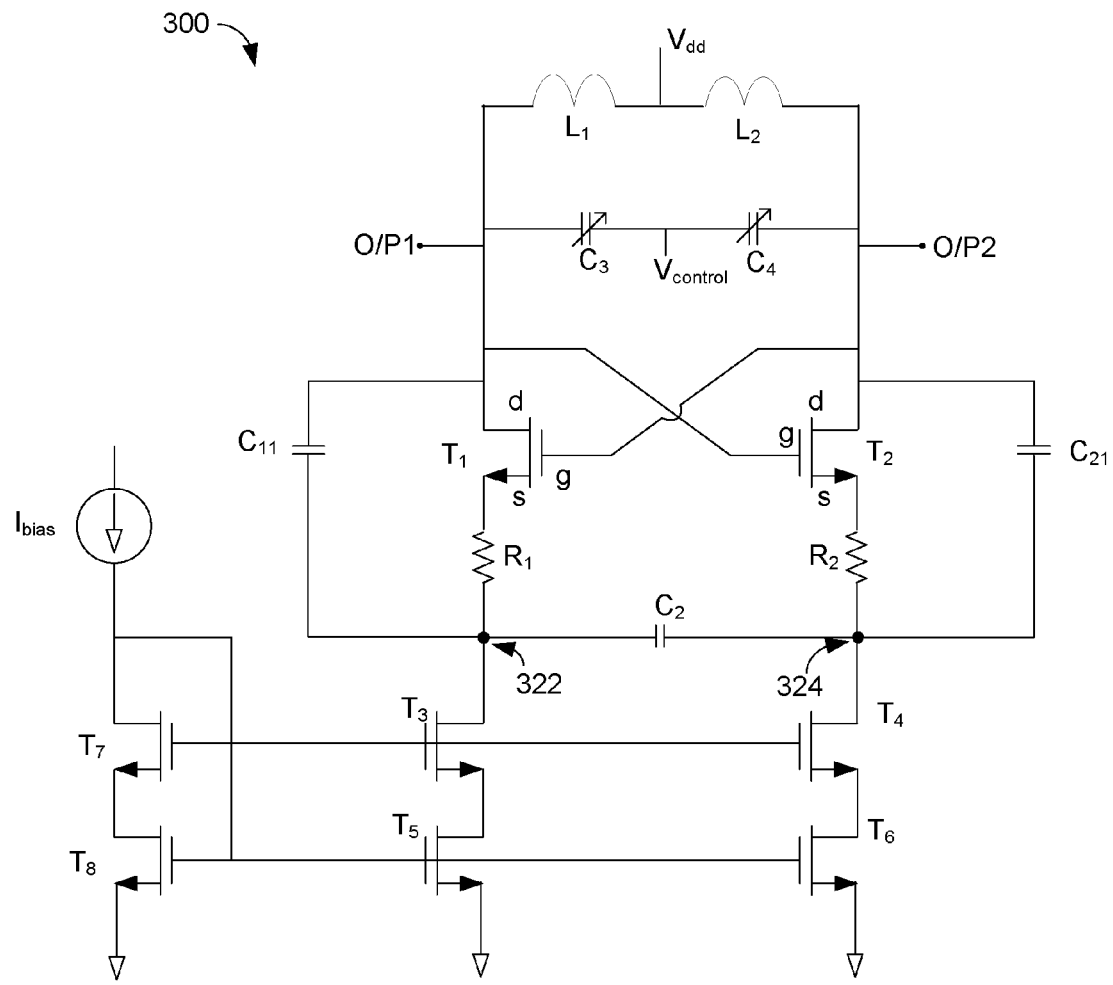
FIG. 3 schematically illustrates another exemplary differential colpitts VCO biased with a wide swing cascode current mirror, in accordance with various embodiments of the present invention.

FIG. 3 schematically illustrates an exemplary differential colpitts VCO 300 biased with a wide swing cascode current mirror, in accordance with various embodiments of the present invention. In various embodiments, one or more components of the VCO 300 may be at least in part similar to the corresponding components of the VCO 200. For example, similar to VCO 200, the VCO 300 may also include the differential pair transistors T1 and T2, and the tank of inductors L1 and L2 and varactors C3 and C4. Similar to the VCO 200 of FIG. 2, the VCO 300 may also include capacitors C11 and C21, and resistances R1 and R2.

In various embodiments, the capacitors C12 and C22 of the VCO 200 of FIG. 2 may be combined in a single capacitor C2 in the VCO 300 of FIG. 3, which may result in improved harmonics performance and reduced area of the VCO 300. The capacitor C2 may be operatively coupled between nodes 322 and 324. Thus, capacitors C11 and C2 may form a first capacitive voltage divider, and capacitors C21 and C2 may form a second capacitive voltage divider, where the capacitor C2 may be common in both the first and second capacitive voltage dividers.

In various embodiments, the current sources $I_{bias1}$ and $I_{bias2}$ of VCO 200 of FIG. 2 may be replaced by a cascode current source in the VCO 300. The cascode current source may include a current source $I_{bias}$ and transistors T3-T8, as illustrated in FIG. 3.

In various embodiments, similar to the VCO 200 of FIG. 2, the resistances R1 and R2 of the VCO in FIG. 3 may decrease the maximum voltage swing of voltages Vgs, Vgd and/or Vds of transistors T1 and/or T2 below a threshold voltage level (e.g., maximum stress tolerance voltage), without significantly decreasing the output voltage swing of the VCO 300, and without significantly adversely affecting the phase noise of the VCO 300.

Although specific embodiments have been illustrated and described herein, it will be appreciated by those of ordinary skill in the art and others, that a wide variety of alternate and/or equivalent implementations may be substituted for the specific embodiment illustrated and described without departing from the scope of the present invention. This present invention covers all methods, apparatus, and articles of manufacture fairly falling within the scope of the appended claims either literally or under the doctrine of equivalents. This application is intended to cover any adaptations or variations of the embodiment discussed herein. Therefore, it is manifested and intended that the invention be limited only by the claims and the equivalents thereof.

What is claimed is:

1. A voltage controlled oscillator (VCO) comprising:
a first transistor;
a first resistor having (i) a first terminal operatively coupled to a source terminal of the first transistor and (ii) a second terminal operatively coupled to a first node;
a first capacitor having (i) a first terminal operatively coupled to a drain terminal of the first transistor and (ii) a second terminal operatively coupled to the first node; and
a second capacitor having (i) a first terminal operatively coupled to the first node and (ii) a second terminal operatively coupled to a ground terminal,
wherein the first capacitor and the second capacitor form a capacitive voltage divider, and
wherein the first node defines a mid-point of the capacitive voltage divider.

2. The VCO of claim 1, further comprising:
a second transistor, wherein the first transistor and the second transistor form a cross coupled transistor pair;
a second resistor operatively coupled between a source terminal of the second transistor and a second node; and
a third capacitor operatively coupled between a drain terminal of the second transistor and the second node.

3. The VCO of claim 2,
wherein a first voltage is substantially equal to a maximum stress tolerance voltage of the first transistor;
wherein a second voltage is substantially equal to a maximum voltage swing that any two terminals of the first transistor would experience if the values of the first resistor and the second resistor were almost equal to 0 ohm;
wherein a third voltage is substantially equal to a difference between the first and second voltages;
wherein a first current is substantially equal to a maximum current that the source terminal of the first transistor would experience if the values of the first resistor and the second resistor were almost equal to 0 ohm; and
wherein a value of the first resistor is chosen to be substantially equal to a ratio of the third voltage and the first current.

4. The VCO of claim 2, wherein a gate terminal of the first transistor is operatively coupled to the drain terminal of the second transistor, and a gate terminal of the second transistor is operatively coupled to the drain terminal of the first transistor.

5. The VCO of claim 2, further comprising:
a fourth capacitor operatively coupled to the second node, wherein the third capacitor and the fourth capacitor form another capacitive voltage divider, wherein the second node defines a mid-point of the another capacitive voltage divider.

6. The VCO of claim 2, further comprising:
an inductor-capacitor (LC) resonator circuit operatively coupled to drain terminals of the first and second transistors.

7. The VCO of claim 2, wherein the first resistor and the second resistor are configured to reduce a maximum voltage experienced by any two terminals of the first transistor and the second transistor, without decreasing a swing of an output voltage of the VCO and without affecting a phase noise of the VCO.

8. The VCO of claim 2, wherein the first transistor and the second transistor are thin oxide low voltage transistors.

9. The VCO of claim 2, wherein the first and second resistors are selected from a group comprising metal-oxide-semiconductor field-effect transistors (MOSFETs), bipolar junction transistors (BJT), field effect transistors (FET), junction gate field-effect transistors (JFET).

10. The VCO of claim 2, wherein the first resistor and the second resistor are adjustable resistors, and wherein a values of the first resistor and the second resistor are programmed based at least in part on a desired voltage swing of an output voltage of the VCO, maximum stress tolerance levels of the first transistor and second transistor, a maximum voltage swing experienced by any two terminals of the first transistor and second transistor, and maximum bias currents of the first transistor and second transistor.

11. The VCO of claim 1, wherein the VCO is a differential colpitts VCO.

12. A differential colpitts voltage controlled oscillator (VCO) comprising:
a cross coupled transistor pair comprising a first transistor and a second transistor;
a first capacitive voltage divider associated with the first transistor and comprising at least a first capacitor;
a second capacitive voltage divider associated with the second transistor and comprising at least a second capacitor;
a first resistor having (i) a first terminal operatively coupled to between a source terminal of the first transistor and (ii) a second terminal operatively coupled to a mid-point of the first capacitive voltage divider the first capacitor, wherein the first capacitor has (i) a first terminal is operatively coupled to between a drain terminal of the first transistor and (ii) a second terminal coupled to the second terminal of the first resistor; and
a second resistor having (i) a first terminal operatively coupled to a source terminal of the second transistor and (ii) a second terminal operatively coupled to a mid-point of the second capacitive voltage divider.

13. The VCO of claim 12, wherein the first capacitive voltage divider comprises a third capacitor having an end operatively coupled in between the first capacitor and the first resistor.

14. The VCO of claim 13, wherein the third capacitor is also a part of the second capacitive voltage divider, and another end of the third capacitor is operatively coupled in between the second capacitor and the second resistor.

15. The VCO of claim 13, wherein the drain terminals of the first and second transistors are operatively coupled to two output ports of the VCO.

16. The VCO of claim 12, wherein the first and second resistors are configured to reduce a maximum voltage swing of a gate to source voltage of the first transistor and second transistor, respectively, below a threshold voltage level, without affecting a swing of an output voltage of the VCO.

17. The VCO of claim 12, wherein the first and second transistors are biased using a cascode current source.

18. A method of forming a differential colpitts voltage controlled oscillator, the method comprising:
forming a cross coupled transistor pair that comprises a first transistor and a second transistor;
forming a first capacitive voltage divider associated with the first transistor, the first capacitive voltage divider comprising at least a first capacitor;
forming a second capacitive voltage divider associated with the second transistor, the second capacitive voltage divider comprising at least a second capacitor;
degenerating a transconductance of the first transistor by operatively coupling (i) a first terminal of a first resistor to a source terminal of the first transistor and (ii) a second terminal of the first resistor to a mid-point of the first capacitive voltage divider, wherein the first capacitor has (i) a first terminal operatively coupled to a terminal of the first transistor and (ii) a second terminal coupled to the second terminal of the first resistor; and
degenerating a transconductance of the second transistor by operatively coupling (i) a first terminal of a second resistor to a source terminal of the second transistor and (ii) a second terminal of the second resistor to a mid-point of the second capacitive voltage divider.

19. The method of claim 18, further comprising:
biasing the first transistor and the second transistor using a cascode current mirror.

* * * * *